United States Patent [19]

Miyazaki et al.

[11] Patent Number: 4,842,891

[45] Date of Patent: Jun. 27, 1989

[54] METHOD OF FORMING A COPPER FILM BY CHEMICAL VAPOR DEPOSITION

[75] Inventors: Hiroshi Miyazaki, Kokubunji; Yoshio Homma, Tokyo; Kiichiro Mukai, Hachioji, all of Japan

[73] Assignee: Hitachi, Ltd., Tokyo, Japan

[21] Appl. No.: 153,606

[22] Filed: Feb. 8, 1988

[30] Foreign Application Priority Data

Feb. 20, 1987 [JP] Japan .................................. 62-35718

[51] Int. Cl.⁴ ......................... B05D 3/06; C23C 16/06
[52] U.S. Cl. ....................................... 427/35; 427/38; 427/252; 437/245
[58] Field of Search ................. 427/35, 50.1, 38, 54.1, 427/124, 123, 250, 252, 253, 255; 437/245

[56] References Cited

U.S. PATENT DOCUMENTS

| | | | |
|---|---|---|---|
| 3,911,194 | 10/1975 | Dejachy et al. | 427/253 |
| 3,914,472 | 10/1975 | Nakanishi et al. | 427/38 |
| 3,949,122 | 4/1976 | Lepetit et al. | 427/253 |
| 4,526,624 | 7/1985 | Tombrello et al. | 427/38 |

FOREIGN PATENT DOCUMENTS 141999  7/1951  Australia .............................. 427/253

*Primary Examiner*—Sadie Childs
*Attorney, Agent, or Firm*—Antonelli, Terry & Wands

[57] ABSTRACT

A copper film is formed by bringing the vapor of an inorganic compound of copper, such as cuprous nitrate that vaporizes upon heating, into contact with a reducing gas in the reaction chamber, so that copper ions are reduced into metal copper that is to be deposited on a substrate. The obtained copper film exhibits very good step coverage and contains very little impurities, lending itself well for forming interconnections of a semiconductor device that has a high degree of integration.

11 Claims, 1 Drawing Sheet

METHOD OF FORMING A COPPER FILM BY CHEMICAL VAPOR DEPOSITION

BACKGROUND OF THE INVENTION

The present invention relates to a method of forming a copper film, and more particularly to a method of forming a copper film, the method being capable of forming on a semiconductor substrate having large steps a copper film by vapor growth that is adapted to constituting interconnections for a variety of semiconductor device.

Accompanying the recent trend toward fabricating highly dense and finer semiconductor devices interconnections of semiconductor devices must meet the following requirements:

(1) Decrease in wiring resistance;
(2) Improvement of electromigration immunity; and
(3) Improvement of step coverage.

The requirements (1) and (2) are associated with the wiring material for interconnection, and the requirement (3) is associated with the method of forming thin films. As is well known, interconnections of semiconductor devices have heretofore been realized by using aluminum or an aluminum alloy. However, copper has an electric resistance which is as low as about two-thirds that of aluminum and further exhibits better electromigration immunity which is superior to that of aluminum or aluminum alloy. That is, when used as an interconnection material for semiconductor devices, copper exhibits superior properties to those of aluminum or an aluminum alloy and may help satisfy the above-mentioned requirements (1) and (2). As for the requirement (3) associated with the method of forming thin films, the step coverage is rather favorably accomplished by the chemical vapor deposition method or the plating method rather than the evaporation method or the sputtering method. The step coverage is not well accomplished by the evaporation method or the sputtering method because particles to be deposited impinge onto and stick on a semiconductor substrate on which a film is to be formed. Therefore, particles are deposited in small amounts on the side or bottom surfaces of the step due to a shadowing effect at the step. With the plating method and the vapor growth method, on the other hand, the reaction material diffuses into holes or grooves whereby, the product formed by the reaction on the surface of the holes or grooves is deposited on the surface, so that a high degree of step coverage is obtained. Further, comparison of the chemical vapor deposition method with the plating method indicates that the chemical vapor deposition method is favorable with regard to decreased film defects represented by impurities, stress and pinholes in the obtained film, and providing excellent film quality. By taking the above-mentioned problems into consideration, therefore, it is possible to improve performance and reliability of the semiconductor integrated circuits if a thin copper film having small electric resistance and excellent electromigration immunity is formed by the chemical vapor deposition method which features good step coverage in order to form an interconnection layer for the semiconductor devices.

Described below is a conventional technology for forming a copper film by the vapor growth method. In the conventional vapor growth method of copper, an organic compound of copper is used as a source gas. In the vapor growth method which uses an organometal compound as a starting material, however, impurities such as carbon and oxygen formed by the decomposition of the organometal compound remain in large amounts in the copper film that is obtained. Therefore, properties of the thus obtained copper film are seriously deteriorated by the impurities. Another defect is that the organic compound of copper is unstable and leaves causes a problem with regard to safety.

Vapor growth of copper has been disclosed, for example, in Appl. Phys. Letter 46, pp. 97-99, 1985.

SUMMARY OF THE INVENTION

The object of the present invention is to provide a method of growing a copper film by chemical vapor deposition which features excellent step coverage, decreased impurity concentration and defects in the film, and increased stability of the film.

In order to achieve the above-mentioned object according to the present invention, an inorganic compound of copper and particularly the vapor of cuprous nitrate is reduced with a reducing low molecular gas such as carbon monoxide, hydrogen, methane or ammonia, so that metal copper is precipitated on the surface of a substrate on which a copper film is to be formed.

DETAILED DESCRIPTION OF THE PREFERRED EMBODIMENTS

Figure 1:
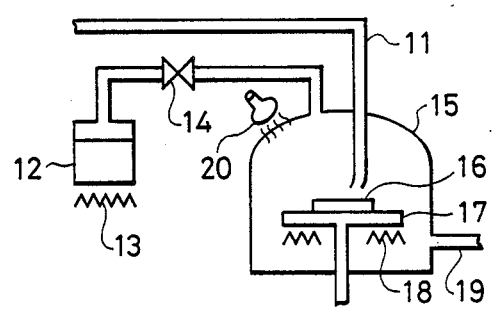
FIGS. 1 and 2 are diagrams which schematically illustrate apparatuses for vapor growth used in the embodiments of the present invention.

In the following description of the invention, cuprous nitrate is used as a starting gas that produces the most desirable results among may inorganic copper compounds that can be used as starting materials.

Anhydrous cuprous nitrate which is a solid at room temperature, has a low sublimation temperature, and turns into vapor at a temperature of 150° to 200° C. under a reduced pressure condition. The present invention is based on a discovery that a copper film can be formed on a substrate if metal copper is deposited on the substrate by the reaction of the vapor of cuprous nitrate with a reducing gas. The present inventors attribute this phenomenon to the mechanism mentioned below. That is, to explain the process for growing a thin copper film, the following description deals with a chemical reaction of the case where the reducing gas consists of carbon monoxide. The reaction takes place as follows:

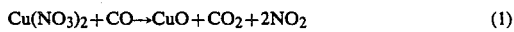

$$Cu(NO_3)_2 + CO \rightarrow CuO + CO_2 + 2NO_2 \quad (1)$$

$$CuO + CO \rightarrow Cu + CO_2 \quad (2)$$

That is, as represented by the formula (1), the cuprous nitrate ($Cu(NO_3)_2$) is once reduced with carbon monoxide (CO) to form copper oxide (CuO) which is then reduced with CO, so that copper Cu is precipitated as represented by the formula (2).

The above reaction proceeds uniformly on the whole surface of the substrate, and the thickness of the copper film does not become extremely thin on the side surfaces of steps, grooves or holes; i.e., good step coverage is obtained.

Here, the reducing reaction of copper oxide takes place as represented by the formula (2) even when the reducing gas is not composed of carbon monoxide. Further, any reaction product can be used provided it produces a large vapor pressure and forms a stable low-molecular gas like carbon dioxide of the formula (2). To obtain a thin copper film having a low oxygen concentration, the reduction reaction (2) of copper oxide must proceed sufficiently faster than the decomposition reaction (1) of cuprous nitrate. When carbon monoxide or hydrogen is used as the reducing gas, it is recommended that the substrate is maintained at a temperature of 200° C. to 650° C. and, preferably at a temperature higher than 250° C. but lower than 500° C., so that a film of good quality is obtained.

To form a copper film having excellent step coverage relying upon the chemical vapor deposition method, the reaction should be suppressed in the vapor phase, and above-mentioned reactions (1) and (2) should be carried out mainly on the surface of the substrate. To cause the reactions on the surface of the substrate while suppressing the reaction in the vapor phase, therefore, the vapor of cuprous nitrate and the reducing gas that are supplied should be maintained at temperatures as low as possible, such that the reaction gas that has reached the surface of the heated substrate receives the heat from the substrate and is heated at the reaction temperature thereon. For this purpose, the aforementioned reactions are carried out under reduced pressure conditions (about 0.1 to 3 Torr) to decrease the number of collisions between gas molecules of a high temperature emitted from the surface of the substrate and formed by the above reaction and molecules of starting gas of a low temperature supplied from an external side, in order to prevent the temperature rise of the supplied gas as much as possible. It is further desired that the walls of the reaction chamber are maintained at a temperature lower than the temperature of the substrate, so that the supplied gas will not be unnecessarily heated, thereby to suppress the reaction in the vapor phase.

To obtain a film of good quality, on the other hand, copper oxide must be completely reduced by the reaction of the aforementioned formula (2). For this purpose, the reducing gas should be supplied in an amount greater than a stoichiometric ratio, so that the reaction of the formula (1) is carried out under the conditions of a rate determining step.

According to the present invention, the most favorable result is obtained when cuprous nitrate is used as a copper compound. Other inorganic copper compounds produce low vapor pressure, require high temperatures for vaporization, and make it difficult to stably supply the starting material or to form the film and, especially, to form a film on an organic insulating film which has a low heat resistance. Further, many organic copper compounds exist in an unstable form and can be vaporized with difficulty. Moreover, hydrocarbons formed by the reaction may be contained in the film as impurities. Therefore, difficulty is involved when organic salts of copper are used. The cuprous nitrate, however, can be stably vaporized at temperatures of as low as 200° C. or lower, making it possible to obtain the vapor of cuprous nitrate. As will be obvious from the aforementioned equations (1) and (2), furthermore, the reaction products are nitrogen dioxide and carbon dioxide which exist in the form of low-molecular gases that will hardly be incorporated in the film as impurities. It is therefore possible to obtain a copper film of high purity and good quality.

Embodiment 1

FIG. 1 is a diagram which schematically illustrates an apparatus for vapor growth used in an embodiment of the present invention.

An evaporator 12 filled with an anhydrous cuprous nitrate is heated by a heater 13 at 210° C. to vaporize the anhydrous cuprous nitrate and to generate the vapor of cuprous nitrate. The vapor is supplied into a reaction chamber 15 via a flow rate adjusting valve 14. At the same time, carbon monoxide is supplied into the reaction chamber 15 from a reducing gas introduction path 11 (cuprous nitrate:carbon monoxide=1:7). The interior of the reaction chamber 15 is maintained at a gas pressure of 0.1 Torr by a vacuum exhaust system (not shown). A semiconductor substrate 16 having tiny square contact holes each side measuring 1.0 μm is placed on a table 17, and is heated at 300° C. by a heater 18. With the vapor of cuprous nitrate and carbon monoxide being introduced into the reaction chamber 15 as described above, the vapor of cuprous nitrate reacts with carbon monoxide on the surface of the substrate 16 so that metal copper is deposited thereon. Unnecessary gases such as $NO_2$ and $CO_2$ formed by the reaction are exhausted through an exhaust port 19. According to this embodiment, copper can be buried in the square contact holes each measuring 1.0 μm. The thus obtained copper film exhibits an electric resistance of 1.8 $\mu\Omega$.cm which is close to the electric resistance of copper bulk, from which it is confirmed that a copper film of very good quality is formed.

Though carbon monoxide is used as a reducing gas in this embodiment, it is also possible to use hydrogen in its place. Use can, further, be made of a gas such as methane or ammonia that generates reducing radicals or ions upon reaction with the cuprous nitrate. In order to increase the rate of copper deposition, furthermore, the temperature of the substrate may be raised. Moreover, the reaction of the formula (2) can be promoted by irradiating the substrate with light of 200 to 1700 nm from a high-pressure mercury lamp 20.

Embodiment 2

Figure 2:
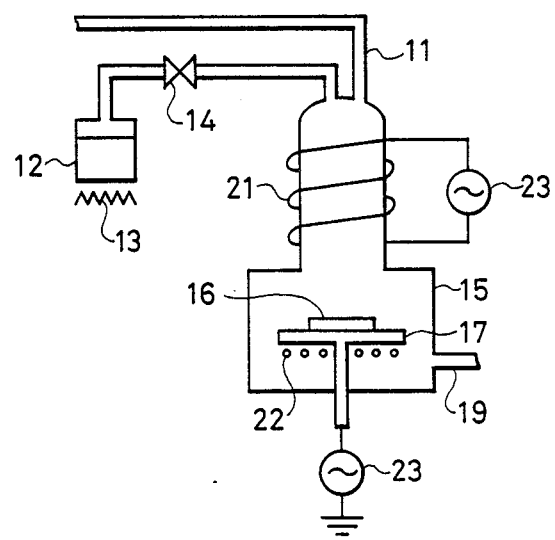

FIG. 2 is a diagram which schematically illustrates another apparatus for chemical vapor growth used for another embodiment of the present invention.

In this embodiment, a plasma discharge is established in the reaction chamber 15 by applying a high-frequency electric power to a high-frequency coil 21 in order to promote the reaction without heating the substrate. The starting gases are supplied at a partial pressure ratio of cuprous nitrate:carbon monoxide=1:5. The plasma discharge is carried out under the conditions of a gas pressure of 0.01 to 0.1 Torr and a high-frequency electric power of 100 to 500 watts, enabling copper to be deposited on the substrate 16. According to this embodiment, the lower surface of the table 17 on which the substrate 16 is placed is cooled by a water-cooling pipe 22 so that the temperature of the substrate irradiated with plasma will not be excessively raised. When a high-frequency voltage is applied to the table 17, furthermore, the thin copper film exhibits better step coverage than when the copper film is formed by an ordinary sputtering method or a vacuum evaporation method, and copper can be buried even in tiny square holes measuring 2 μm.

Embodiment 3

The above-mentioned embodiments have dealt with the cases where cuprous nitrate was used as an inorganic compound of copper. It is confirmed that a copper film is formed by the reduction with hydrogen even when a halide of copper such as cuprous chloride or cuprous iodide is used as an inorganic compound of copper. That is, the copper film is formed on the substrate 16 when cuprous chloride and cuprous iodide are heated at 500° C., respectively, and when hydrogen is added as a reducing gas using the same apparatus as that of the embodiment 1. However, the halide of copper produces only a low vapor pressure and is not capable of supplying the vapor as stably as when cuprous nitrate is used. Furthermore, since the halide of copper is thermally more stable than cuprous nitrate, the deposition rate comparable to that of cuprous nitrate is obtained when the substrate is heated at a temperature higher than 500° C.

When cuprous nitrate is used as an inorganic compound of copper, the following advantages are obtained in addition to the aforementioned advantages compared with the use of cuprous halide. That is, when a metal that can be easily corroded with a halide, such as aluminum or titanium, is exposed on the surface of the substrate, it is not recommended to use the chemical vapor deposition method which uses cuprous halide as a starting material. With the vapor growth method which uses cuprous nitrate as a starting material, however, copper can be deposited without causing aluminum or titanium to be corroded.

In the present invention, the temperature of the substrate on which the copper film is to be formed should be maintained at 200° C. to 650° C. When the temperature of the substrate is lower than 200° C., copper is deposited at a very decreased rate. The higher the temperature of the substrate, the greater the deposition rate of copper. However, if the substrate temperature exceeds about 650° C., the particle diameter of the obtained copper film becomes so great that the copper film loses characteristics as, an interconnection for the semiconductor devices. It is therefore recommended that copper be deposited while maintaining the substrate temperature at about 200° C. to 650° C. More favorable results are obtained if the substrate temperature is maintained at about 250° C. to 500° C.

The gas pressure in the reaction chamber is selected to be from 0.1 to 3 Torr as described earlier. When the pressure is lower than 0.1 Torr, the deposition rate of copper becomes extremely low and when the pressure is higher than about 3 Torr, on the other hand, the reaction takes place in the vapor phase which is detrimental to the step coverage as described earlier. As mentioned in connection with the embodiment 2, however, the pressure in the reaction chamber can be decreased to about 0.01 Torr if the plasma discharge is utilized.

In order to obtain a copper film of good quality, the reducing gas should be added in an amount slightly greater than an amount (stoichiometric ratio) that is necessary for perfectly reducing copper ions in the starting gas to precipitate copper. For instance, when cuprous nitrate is used as the starting gas and carbon monoxide is used as the reducing gas, their stoichiometric ratio is 1:2 (mol ratio) as will be obvious from the reaction formulas (1) and (2) mentioned earlier. Favorable results, however, are obtained if their ratio is selected to be greater than the above ratio, i.e., selected to be about 1:3 to about 1:10.

According to the present invention as will be, obvious from the above description, it is possible to form a thin copper film having good step coverage. When the present invention is adapted to the semiconductor devices, copper can be buried even in tiny and deep contact holes. This eliminates the break of lines during fabrication, or electromigration in the contact hole during operation, contributing to greatly improving the reliability. Moreover, the impurity concentration is lower in the film than that of the films obtained by other chemical vapor deposition methods or plating methods. Further, the copper film exhibits electric resistance that is close to the bulk value of copper. In other words, the copper film exhibits very small electric resistance, making it possible to reduce the delay time caused by the interconnections and enabling the semiconductor devices to exhibit greatly improved performance.

What is claimed is:

1. A method of forming a copper film by depositing copper on a semiconductor substrate that is placed in a reaction chamber, wherein vapor of cuprous nitrate is brought into contact with a reducing gas in said reaction chamber, said vapor of cuprous nitrate being obtained by heating solid cuprous nitrate.

2. A method of forming a copper film according to claim 1, wherein said reducing gas is selected from the group consisting of carbon monoxide, hydrogen, ammonia, and methane.

3. A method of forming a copper film according to claim 1, wherein the temperature of said semiconductor substrate is maintained at 200° C. to 650° C.

4. A method of forming a copper film according to claim 3, wherein said temperature is from 250° C. to 500° C.

5. A method of forming a copper film according to claim 1, wherein the gas pressure in said reaction chamber is from 0.1 Torr to 3 Torr.

6. A method of forming a copper film according to claim 1, wherein the ratio of the amount of said cuprous nitrate to the amount of said reducing gas is greater than a stoichiometric ratio.

7. A method of forming a copper film according to claim 6, wherein said reducing gas consists of carbon monoxide, and a mol ratio of said cuprous nitrate to said carbon monoxide is from 1:3 to 1:10.

8. A method of forming a copper film according to claim 1, wherein said copper is deposited by forming a plasma in said reaction chamber.

9. A method of forming a copper film according to claim 1, wherein the gas pressure in said reaction chamber ranges from 0.01 Torr to 0.1 Torr.

10. A method of forming a copper film according to claim 1, wherein said copper is deposited by irradiating said semiconductor substrate with light.

11. A method of forming a copper film according to claim 1, wherein a surface of said semiconductor substrate comprises at least one of steps, grooves and holes, and wherein said copper film is deposited uniformly on and exhibits good coverage of said surface of said semiconductor substrate.

* * * * *